United States Patent [19]
Hong

[11] Patent Number: 5,298,447
[45] Date of Patent: Mar. 29, 1994

[54] METHOD OF FABRICATING A FLASH MEMORY CELL

[75] Inventor: Gary Hong, Hsinchu, Taiwan

[73] Assignee: United Microelectronics Corporation, Hsinchu, Taiwan

[21] Appl. No.: 94,744

[22] Filed: Jul. 22, 1993

[51] Int. Cl.$^5$ .......................................... H01L 21/265
[52] U.S. Cl. ........................................ 437/43; 437/48; 437/52; 437/238
[58] Field of Search ...................... 437/43, 48, 52, 238; 257/321, 324

[56] References Cited

U.S. PATENT DOCUMENTS

| | | | |
|---|---|---|---|
| 4,804,637 | 2/1989 | Smayling et al. | 437/43 |
| 4,833,096 | 5/1989 | Huang et al. | 437/43 |
| 5,019,527 | 5/1991 | Ohshima et al. | 437/43 |

OTHER PUBLICATIONS

"Electrically-Alterable Memory Using A Dual Electron Injector Structure" by D. J. Dimaria et al., Elec. Dev. Let. vol. EDL-1, No. 9, Sep. 1990.

"Optimized Silicon-Rich(SRO) Deposition Process for 5V Only Flash EEPROM Applications" by L. Dori et al., IEEE Electron Device Letters, Jun. 1993, vol. 14, No. 6, pp. 283-285.

*Primary Examiner*—Tom Thomas
*Attorney, Agent, or Firm*—George O. Saile; Graham S. Jones

[57] ABSTRACT

A flash memory cell includes the usual thermal oxide layer deposited above the substrate including the source and the drain. On the thermal oxide layer, a silicon rich oxide layer is formed. Above the silicon rich oxide layer a gate structure is formed of layer of polysilicon separated by an intermediate dielectric layer. The lower polysilicon layer commences as an initial portion of the layer of small grain size followed by either amorphous or large grain size material.

18 Claims, 1 Drawing Sheet

METHOD OF FABRICATING A FLASH MEMORY CELL

BACKGROUND OF THE INVENTION

1. Field of the Invention

This invention relates to FET memory cells and more particularly to flash memory cells.

2. Description of Related Art

A conventional FLASH memory cell, such as an ETOX (Eprom with Tunnel Oxide) cell uses a self-aligned double polysilicon (poly) structure as shown in FIG. 1 in which a substrate of semiconductor material 10 has been doped in the conventional way to form a source 11 and a drain 12. The semiconductor material 10 including the source 11 and drain 12 is coated with a tunnel oxide thin film 14. A gate structure 16 is formed on top of the tunnel oxide film 14. The first layer of the gate structure is a first polysilicon layer 18, referred to hereinafter as "poly 1" carrying an intermediate dielectric layer 19. An upper layer 25 comprises a second poly layer "poly 2."

A conventional flash memory cell has the disadvantage of critical thin dielectric in the form of a tunnel oxide for "F-N" (Fowler-Norheim) tunneling. The tunnel oxide must be thin (~100 Å) for F-N tunneling to provide erasing. Therefore, the reliability i.e., $Q_{Bd}$ (charge to breakdown) is a serious concern. Also, the thin tunnel oxide results in a poor coupling ratio for memory cell characteristics.

SUMMARY OF THE INVENTION

In accordance with this invention a self-aligned flash MOS field effect transistor is provided comprising:

a) a silicon semiconductor substrate having an upper surface,
b) a source region and a drain region formed in the substrate on the surface,
c) a tunnel oxide structure deposited over the surface of the substrate including the surface of the source and the drain regions,
d) the tunnel oxide structure including a thermal oxide layer deposited upon the substrate and a film of silicon rich oxide deposited upon the thermal oxide layer, and
e) a gate structure composed of a stack deposited upon the silicon rich oxide film, the stack comprising a first polysilicon layer, a dielectric layer deposited upon the polysilicon layer and a second polysilicon layer deposited upon the dielectric layer.

Preferably, in the transistor structure, the first polysilicon layer of the gate structure preferably includes a lower portion composed of relatively smaller grain size crystals, and an upper portion composed of a structure composed of larger grain size crystals.

The polysilicon layer of the gate structure preferably includes a lower portion composed of relatively smaller grain size crystals, and an upper portion composed of larger grain size amorphous polysilicon.

Preferably, the lower portion of the first polysilicon portion of the gate structure comprises a structure deposited by LPCVD at a temperature of about 630° C. and the upper portion of the first layer of polysilicon is deposited as amorphous phase silicon by LPCVD at a temperature of about 560° C.

Preferably, the first portion has a thickness of between about 300 Å and about 600 Å thick and the second portion is between about 1000 Å and about 2000 Å thick.

Preferably a native polyoxide is provided as a boundary between the lower portion and the upper portion of the first polysilicon layer; and the dielectric layer comprises oxide-nitride oxide.

It is further proferred that the oxide-nitride-oxide is formed by a thin thermal oxide of about ~80 Å followed by the layer of nitride deposited by LPCVD ~100 Å and final oxide layer between about 20 Å and about 50 Å.

Preferably the transistor structure includes a substrate with a source junction and a drain junction therein and a tunnel oxide structure deposited thereon, the improvement comprising, the tunnel oxide comprising a thermal oxide layer deposited upon the semiconductor substrate and a silicon-rich-oxide layer deposited upon the thermal oxide layer, and a flash memory gate structure deposited upon the silicon-rich-oxide layer.

Preferably the thickness of the silicon rich oxide layer is within the range between about 50 Å and about 200 Å and the thickness of the thermal oxide layer is within the range between about 50 Å and about 100 Å.

Preferably, the silicon rich oxide has been deposited by chemical vapor deposition.

In another aspect of the invention a method is provided for forming a self-aligned flash MOS field effect transistor structure on a silicon semiconductor substrate having an upper surface, a) forming a source region and a drain region in the substrate on the upper surface,
b) forming a tunnel oxide structure over the surface of the substrate including the surface of the source and the drain regions,
c) the tunnel oxide structure including a thermal oxide layer deposited upon the substrate and a film of silicon rich oxide deposited upon the thermal oxide layer, and
e) depositing a gate structure composed of a stack upon the silicon rich oxide film, the stack comprising a first polysilicon layer, a dielectric layer deposited upon the polysilicon layer and a second polysilicon layer deposited upon the dielectric layer.

Preferably, the first polysilicon layer includes a lower portion composed of relatively smaller grain size crystals, and an upper portion composed of a structure composed of larger grain size crystals.

It is further preferred that the lower portion of the first polysilicon layer is deposited by LPCVD at a temperature of about 630° C. and the upper portion of the first layer of polysilicon is deposited as amorphous phase silicon by LPCVD at a temperature of about 560° C.; and a native polyoxide is provided as a boundary between the lower portion and the upper portion of the first polysilicon layer; and/or the first polysilicon layer includes a lower portion composed of relatively smaller grain size crystals, and an upper portion composed of amorphous polysilicon.

Alternatively a method is provided for forming a self-aligned flash MOS field effect transistor structure on a silicon semiconductor substrate with a source junction and a drain junction therein and the substrate having a surface a tunnel oxide structure deposited thereon, the improvement comprising, the tunnel oxide comprising a thermal oxide layer deposited upon the substrate and a silicon-rich-oxide layer deposited upon the thermal oxide layer, and a flash memory gate structure deposited upon the silicon-rich-oxide layer.

Preferably, the thickness of the silicon rich oxide layer is within the range between about 50 Å and 200 Å and the thickness of the thermal oxide layer is within the range between about 50 Å and 100 Å; and the silicon rich oxide is deposited by chemical vapor deposition.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention is based on an ETOX cell and pertains to the building of an improved, optimized and manufacturable flash memory cell by modifying poly 1 and tunnel oxide structures with a multilayer polysilicon layer and "silicon rich-oxide" (SRO) to enhance flash erasing speed, EPROM coupling ratio and to obtain good charge retention ability.

Figure 1:
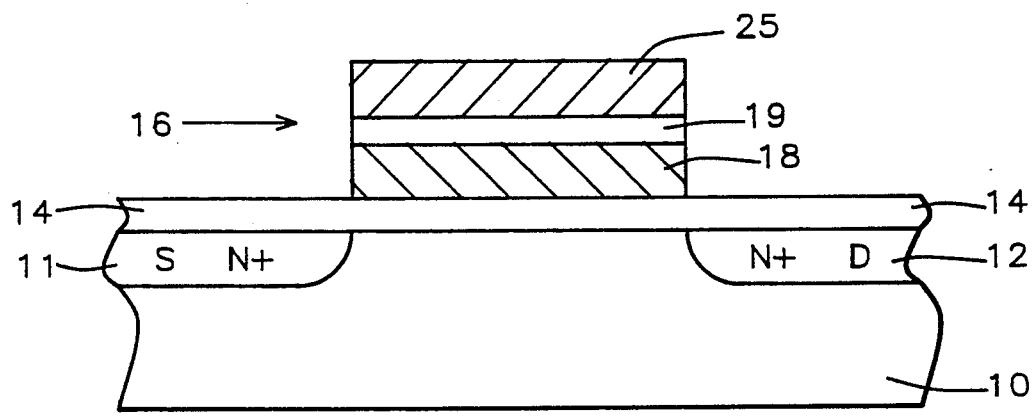
FIG. 1 shows a prior art flash memory cell with the usual thermal oxide layer (deposited above the source and drain) on which a gate structure is formed of layers of polysilicon separated by an intermediate dielectric layer.

Optimization of the structure of poly 1 layer 18 in FIG. 1 to alter its property for flash erasing and charge retention is a dilemma.

In accordance with this invention, large grain size and a smooth surface for poly 1 is effective to provide an intermediate layer of "interpoly dielectric" which provides for improved charge retention. However, small poly 1 grain size or poly asperities will favor flash erasing speed.

Figure 2:
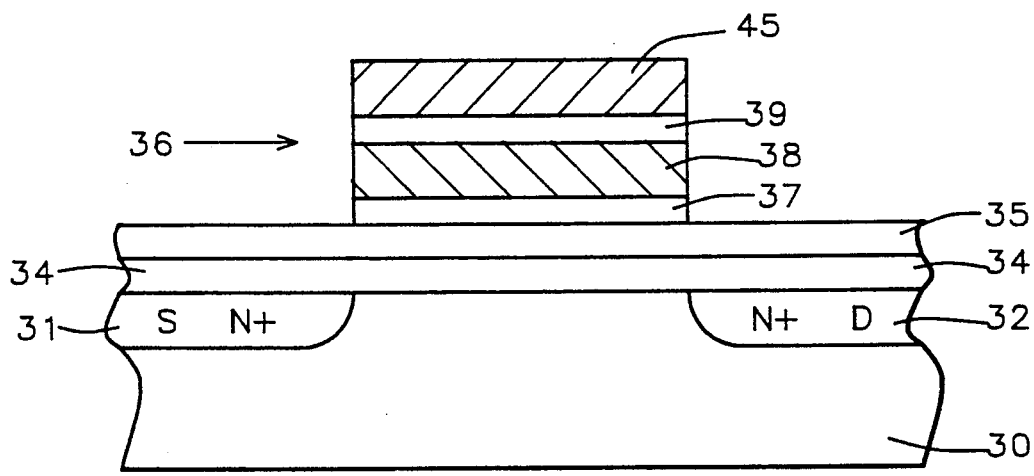
FIG. 2 shows an improvement in the structure of FIG. 1 wherein a flash memory cell in accordance with this invention includes a silicon rich oxide layer above the thermal oxide layer, and a modification of the lower layer of polysilicon in which there is an initial layer of small grain size followed by either an amorphous material or a large grain size material.

The detailed cell structure of this invention is shown in FIG. 2, wherein a substrate of semiconductor material 30 composed of lightly doped silicon is doped in the conventional way to form a source 31 and a drain 32. The semiconductor material 30, including the source 31 and drain 32, is coated with a thin film 34 of tunnel oxide (thermal oxide.) In the case of the instant invention, a new "SRO" (Silicon Rich Oxide) film 35 is deposited upon the tunnel oxide film 34. A gate structure 36 is deposited upon the tunnel oxide film 34. A gate structure 36 is formed on top of the SRO film 35. The first layer of the gate structure 36 is a bottom "poly 1" layer 37 with small grain size followed by a top "poly 1" layer 38 which is either amorphous or has large grain size polysilicon. Layers 37 and 38 form a floating gate structure. Layer 38 of the floating gate carries an intermediate dielectric layer 39. An upper layer 45 comprising a control gate is a second polysilicon layer referred to hereinafter as "poly 2."

The tunnel oxide layer 34 comprises a thermal oxide layer. The silicon-rich-oxide (SRO) layer 35 upon thermal oxide layer 34 is preferably deposited by a chemical vapor deposition (CVD) process. The floating gate 37, 38 is constructed by a double-layer poly 1 (polysilicon) structure. The bottom layer 37 of poly 1 is a thin layer (300–600 Å) and the top layer 38 of poly 1 is thicker (1000–2000 Å) and is formed by a different process, as described below.

The flash erasing involves use of a high voltage across poly 2 45 and the S/D junction or substrate, the electrons stored in floating gate poly 1 37, 38 are pulled out through tunnel oxide by the F-N tunnel effect. The purpose of the SRO layer 35 is to enhance the erasing speed by enhanced electron injection from the higher electric field at the surface of silicon islands in the SRO layer 35. The thin thermal oxide layer 34 maintains the high quality of the interface between the SRO layer 35 and the surface of semiconductor 30 composed of lightly doped silicon. The thickness of SRO layer 35 can be between about 50–200 Å and the thickness of thermal oxide layer 34 can be 50–100 Å.

The total tunnel oxide thickness (SRO 34 plus thermal oxide 35) will be thicker than that of a conventional tunnel oxide and still have higher F-N tunneling current and erasing speed. The thicker tunnel oxide will result in better $Q_{Bd}$ and high coupling ratio for EPROM programming and read characteristics. The multilayers 35 and 37 of poly 1 are provided to enhance the flash erasing and charge retention characteristics. The two layers 35 and 37 of poly 1 can be optimized in terms of polysilicon grain size, etc. to enhance erasing and to obtain good charge retention characteristics.

The bottom thicker "poly 1" layer 38 is deposited by LPCVD at temperatures of ~630° C. and is lightly doped with impurities which result in a smaller grain size of polysilicon with a considerable quantity of asperities (i.e. sharp corners.) The abundant grain boundaries and asperities enhance the electric field and consequently enhance the erasing speed.

The top thicker "poly 1" layer 38 is deposited by LPCVD with lower temperature of ~560° C. and hence forms "amorphous" phase silicon, which has a larger grain size and a smoother surface. The inter poly dielectric can be thermal oxide or ONO (oxide-nitride-oxide.) The ONO is formed by a thin thermal oxide (~80 Å) followed by LPCVD of nitride (~100 Å) and final thermal oxidation or CVD oxide (20 Å–50 Å.)

This interpoly dielectric layer 39 is formed on the surface of the smoother poly 1 layer 38, resulting in the property of good electrical isolation and hence low leakage current and good capacity for charge retention of the charge stored in the poly 1 layers 37, 38 after EPROM programming. Furthermore, the formation process of inter-poly dielectric layer 39 must be chosen so as to either leave the top poly 1 layer 38 amorphous or with very large grain size. The boundary between the two poly 1 layers 37 and 38 can be native polyoxide, that is a good interrupting material for grain growth and is a good conducting interface between poly 1 layers as well.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a self-aligned flash MOS field effect transistor structure on a silicon semiconductor substrate having an upper surface,
   a) forming a source region and a drain region in said substrate on said upper surface,
   b) forming a tunnel oxide structure over the surface of said substrate including the surface of said source and said drain regions,
   c) said tunnel oxide structure including a thermal oxide layer formed on the surface said substrate and a film of silicon rich oxide deposited upon said thermal oxide layer, and
   e) depositing a gate structure composed of a stack upon said silicon rich oxide film, said stack comprising a first polysilicon layer, a dielectric layer deposited upon said polysilicon layer and a second polysilicon layer deposited upon said dielectric layer.

2. A method in accordance with claim 1 wherein said silicon rich oxide is deposited by chemical vapor deposition.

3. A method in accordance with claim 1 wherein said first polysilicon layer includes a lower portion composed of relatively smaller grain size crystals, and an upper portion composed of amorphous polysilicon.

4. A method in accordance with claim 3 wherein said silicon rich oxide is deposited by chemical vapor deposition.

5. A method in accordance with claim 1 wherein said first polysilicon layer includes a lower portion composed of relatively smaller grain size crystals, and an upper portion composed of a structure composed of larger grain size crystals.

6. A method in accordance with claim 5 wherein said silicon rich oxide is deposited by chemical vapor deposition.

7. A method in accordance with claim 5 wherein the thickness of said silicon rich oxide layer is within the range between about 50 Å and about 200 Å and the thickness of said thermal oxide layer is within the range between about 50 Å and about 100 Å.

8. A method in accordance with claim 7 wherein said silicon rich oxide is deposited by chemical vapor deposition.

9. A method in accordance with claim 5 wherein said lower portion of said first polysilicon layer is deposited by LPCVD at a temperature of about 630° C. and said upper portion of said first layer of polysilicon is deposited as amorphous phase silicon by LPCVD at a temperature of about 560° C.

10. A method in accordance with claim 9 wherein the thickness of said silicon rich oxide layer is within the range between about 50 Å and about 200 Å and the thickness of said thermal oxide layer is within the range between about 50 Å and about 100 Å.

11. A method in accordance with claim 9 wherein said silicon rich oxide is deposited by chemical vapor deposition.

12. A method in accordance with claim 9 wherein a native polyoxide is provided as a boundary between said lower portion and said upper portion of said first polysilicon layer.

13. A method in accordance with claim 12 wherein the thickness of said silicon rich oxide layer is within the range between about 50 Å and about 200 Å and the thickness of said thermal oxide layer is within the range between about 50 Å and about 100 Å.

14. A method in accordance with claim 12 wherein said silicon rich oxide is deposited by chemical vapor deposition.

15. A method of forming a self-aligned flash MOS field effect transistor structure on a silicon semiconductor substrate with a source junction and a drain junction therein and said substrate having a surface a tunnel oxide structure deposited thereon,
   the improvement comprising, said tunnel oxide comprising a thermal oxide layer deposited upon said substrate and a silicon-rich-oxide layer deposited upon said thermal oxide layer, and
   a flash memory gate structure deposited upon said silicon-rich-oxide layer.

16. A method in accordance with claim 1 wherein the thickness of said silicon rich oxide layer is within the range between about 50 Å and about 200 Å and the thickness of said thermal oxide layer is within the range between about 50 Å and about 100 Å.

17. A method in accordance with claim 16 wherein said silicon rich oxide is deposited by chemical vapor deposition.

18. A method in accordance with claim 15 wherein said silicon rich oxide is deposited by chemical vapor deposition.

* * * * *